(12) United States Patent
Lee (10) Patent No.: US 7,960,204 B2
(45) Date of Patent: Jun. 14, 2011

(54) METHOD AND STRUCTURE FOR ADHESION OF ABSORBER MATERIAL FOR THIN FILM PHOTOVOLTAIC CELL

(75) Inventor: Howard W. H. Lee, Saratoga, CA (US)

(73) Assignee: Stion Corporation, San Jose, CA (US)

( * ) Notice: Subject to any disclaimer, the term of this patent is extended or adjusted under 35 U.S.C. 154(b) by 0 days.

(21) Appl. No.: 12/558,117

(22) Filed: Sep. 11, 2009

(65) Prior Publication Data

US 2010/0081230 A1     Apr. 1, 2010

Related U.S. Application Data

(60) Provisional application No. 61/101,643, filed on Sep. 30, 2008.

(51) Int. Cl.
*H01L 21/00* (2006.01)

(52) U.S. Cl. .......... 438/85; 438/57; 438/69; 438/73; 438/95

(58) Field of Classification Search .......... 438/57, 438/69, 73, 85, 95
See application file for complete search history.

(56) References Cited

U.S. PATENT DOCUMENTS

| | | | |
|---|---|---|---|
| 4,996,108 A | 2/1991 | Divigalpitiya et al. | |
| 5,125,984 A | 6/1992 | Kruehler et al. | |
| 5,261,968 A | 11/1993 | Jordan | |
| 5,445,847 A * | 8/1995 | Wada et al. | 427/74 |
| 5,501,744 A | 3/1996 | Albright et al. | |
| 5,536,333 A | 7/1996 | Foote et al. | |
| 5,665,175 A | 9/1997 | Safir | |
| 6,048,442 A * | 4/2000 | Kushiya et al. | 204/192.28 |
| 6,328,871 B1 | 12/2001 | Ding et al. | |
| 6,653,701 B1 * | 11/2003 | Yamazaki et al. | 257/414 |
| 2006/0220059 A1 | 10/2006 | Satoh et al. | |
| 2007/0089782 A1 | 6/2007 | Scheuten et al. | |
| 2007/0151596 A1 | 6/2007 | Nasuno et al. | |
| 2007/0169810 A1 | 6/2007 | Van Duern et al. | |
| 2008/0041446 A1 | 2/2008 | Wu et al. | |
| 2008/0057616 A1 * | 3/2008 | Robinson et al. | 438/95 |
| 2008/0092945 A1 | 3/2008 | Munteanu et al. | |
| 2008/0092953 A1 | 3/2008 | Lee | |
| 2008/0092954 A1 * | 4/2008 | Choi | 136/262 |
| 2010/0210064 A1 * | 8/2010 | Hakuma et al. | 438/95 |
| 2010/0267190 A1 * | 10/2010 | Hakuma et al. | 438/95 |

OTHER PUBLICATIONS

Ellmer et al., Copper Indium Disulfide Solar Cell Absorbers Prepared in a One-Step Process by Reactive Magnetron Sputtering from Copper and Indium Targets; Elsevier Science B.V; Thin Solid Films 413 (2002) pp. 92-97.

(Continued)

*Primary Examiner* — Mary Wilczewski
*Assistant Examiner* — Bac H Au
(74) *Attorney, Agent, or Firm* — Kilpatrick Townsend and Stockton LLP (57) ABSTRACT

A method for forming a thin film photovoltaic device includes providing a transparent substrate comprising a surface region and forming a first electrode layer overlying the surface region. The method further includes forming a thin layer of copper gallium material overlying the first electrode layer to act as an intermediary adhesive layer to facilitate attachment to the first electrode layer. Additionally, the method includes forming a copper layer overlying the thin layer and forming an indium layer overlying the copper layer to form a multi-layered structure and subjecting the multilayered structure to thermal treatment process with sulfur bearing species to form a copper indium disulfide alloy material. The copper indium disulfide alloy material comprises a copper:indium atomic ratio of about 1.2:1 to about 3.0:1 overlying a copper gallium disulfide material converted from the thin layer. Furthermore, the method includes forming a window layer overlying the copper indium disulfide alloy material.

16 Claims, 8 Drawing Sheets

OTHER PUBLICATIONS

International Search Report & Written Opinion of PCT Application No. PCT/US 09/46161, date of mailing Jul. 27, 2009, 14 pages total.

International Search Report & Written Opinion of PCT Application No. PCT/US 09/46802, mailed on Jul. 31, 2009, 11 pages total.

Onuma et al., Preparation and Characterization of CuInS Thin Films Solar Cells with Large Grain, Elsevier Science B.V; Solar Energy Materials & Solar Cells 69 (2001) pp. 261-269.

* cited by examiner

METHOD AND STRUCTURE FOR ADHESION OF ABSORBER MATERIAL FOR THIN FILM PHOTOVOLTAIC CELL

CROSS-REFERENCES TO RELATED APPLICATIONS

This application claims priority to U.S. Provisional Patent Application No. 61/101,643, filed Sep. 30, 2008, entitled "METHOD AND STRUCTURE FOR ADHESION OF ABSORBER MATERIAL FOR THIN FILM PHOTOVOLTAIC CELL" by inventor HOWARD W. H. LEE, commonly assigned and incorporated by reference herein for all purposes.

BACKGROUND OF THE INVENTION

The present invention relates generally to photovoltaic materials and manufacturing method. More particularly, the present invention provides a method and structure using a material facilitating adhesion between an absorber material and electrode material for manufacture of high efficiency thin film photovoltaic cells. Merely by way of example, the present method and materials include absorber materials made of copper indium disulfide species, copper tin sulfide, iron disulfide, or others for single junction cells or multi junction cells.

From the beginning of time, mankind has been challenged to find ways of harnessing energy. Energy comes in forms such as petrochemical, hydroelectric, nuclear, wind, biomass, solar, and more primitive forms such as wood and coal. Over the past century, modern civilization has relied upon petrochemical energy as an important energy source. Petrochemical energy includes gas and oil. Gas includes lighter forms such as butane and propane, commonly used to heat homes and serve as fuel for cooking. Gas also includes gasoline, diesel, and jet fuel, commonly used for transportation purposes. Heavier forms of petrochemicals can also be used to heat homes in some places. Unfortunately, the supply of petrochemical fuel is limited and essentially fixed based upon the amount available on the planet Earth. Additionally, as more people use petroleum products in growing amounts, it is rapidly becoming a scarce resource, which will eventually become depleted over time.

More recently, environmentally clean and renewable source energy has been desired. An example of a clean source of energy is hydroelectric power. Hydroelectric power is derived from electric generators driven by the flow of water produced by dams such as the Hoover Dam in Nevada. The electric power generated is used to power a large portion of the city of Los Angeles in California. Clean and renewable sources of energy also include wind, waves, biomass, and the like. That is, windmills convert wind energy into more useful forms of energy such as electricity. Still other types of clean energy include solar energy. Specific details of solar energy can be found throughout the present background and more particularly below.

Solar energy technology generally converts electromagnetic radiation from the sun to other useful forms of energy. These other forms of energy include thermal energy and electrical power. For electrical power applications, solar cells are often used. Although solar energy is environmentally clean and has been successful to a point, many limitations remain to be resolved before it becomes widely used throughout the world. As an example, one type of solar cell uses crystalline materials, which are derived from semiconductor material ingots. These crystalline materials can be used to fabricate optoelectronic devices that include photovoltaic and photodiode devices that convert electromagnetic radiation to electrical power. However, crystalline materials are often costly and difficult to make on a large scale. Additionally, devices made from such crystalline materials often have low energy conversion efficiencies. Other types of solar cells use "thin film" technology to form a thin film of photosensitive material to be used to convert electromagnetic radiation into electrical power. Similar limitations exist with the use of thin film technology in making solar cells. That is, efficiencies are often poor. Additionally, film reliability is often poor and cannot be used for extensive periods of time in conventional environmental applications. Often, thin films are difficult to mechanically integrate with each other. These and other limitations of these conventional technologies can be found throughout the present specification and more particularly below.

From the above, it is seen that improved techniques for manufacturing photovoltaic materials and resulting devices are desired.

BRIEF SUMMARY OF THE INVENTION

According to embodiments of the present invention, a method and a structure for forming thin film semiconductor materials for photovoltaic applications are provided. More particularly, the present invention provides a method and structure using a material facilitating adhesion between an absorber material and electrode material for manufacture of high efficiency thin film photovoltaic cells. But it would be recognized that the present invention has a much broader range of applicability, for example, embodiments of the present invention may be used to form other semiconducting thin films or multilayers comprising iron sulfide, cadmium sulfide, zinc selenide, and others, and metal oxides such as zinc oxide, iron oxide, copper oxide, and others.

In a specific embodiment, the present invention provides a method for forming a thin film photovoltaic device. The method includes providing a transparent substrate comprising a surface region. The method further includes forming a first electrode layer overlying the surface region of the transparent substrate. Additionally, the method includes forming a thin layer of at least copper gallium material or gallium sulfide material, using a sputtering target of copper gallium material or gallium sulfide material, respectively, overlying the first electrode layer to act as an intermediary adhesive layer to facilitate attachment to the first electrode layer. The method further includes forming a copper layer overlying the thin layer of at least copper gallium material or gallium sulfide material. Furthermore, the method includes forming an indium layer overlying the copper layer to form a multilayered structure including at least the thin layer, copper layer, and the indium layer. Moreover, the method includes subjecting at least the multilayered structure to thermal treatment process in an environment containing sulfur bearing species to form a copper indium disulfide alloy material. The copper indium disulfide alloy material comprises an atomic ratio of copper:indium ranging from about 1.35:1 to about 3.0:1 overlying a copper gallium disulfide material converted from the thin layer of at least copper gallium material or gallium sulfide material. In another specific embodiment, the method also includes forming a window layer overlying the copper indium disulfide alloy material. Furthermore, the method includes forming a second electrode layer overlying the window layer.

Many benefits are achieved by way of the present invention. For example, the present invention uses starting materials that are commercially available to form a thin film of semiconductor bearing material overlying a suitable substrate member. The thin film of semiconductor bearing material can be further processed to form a semiconductor thin film material of desired characteristics, such as atomic stoichiometry, impurity concentration, carrier concentration, doping, and others. Additionally, the present method uses environmentally friendly materials that are relatively less toxic than other thin-film photovoltaic materials. Depending on the embodiment, one or more of the benefits can be achieved. In a preferred embodiment, the present method uses a glue layer, which is consumed into the absorber material, to facilitate bonding to an electrode structure. These and other benefits will be described in more detail throughout the present specification and particularly below. Merely by way of example, the present method and materials include absorber materials made of copper indium disulfide species, copper tin sulfide, iron disulfide, or others for single junction cells or multi junction cells.

DETAILED DESCRIPTION OF THE INVENTION

According to embodiments of the present invention, a method and a structure for forming semiconductor materials for photovoltaic applications are provided. More particularly, the present invention provides a method and structure using a material facilitating adhesion between an absorber material and electrode material for manufacture of high efficiency thin film photovoltaic cells. But it would be recognized that the present invention has a much broader range of applicability, for example, embodiments of the present invention may be used to form other semiconducting thin films or multilayers comprising iron sulfide, cadmium sulfide, zinc selenide, and others, and metal oxides such as zinc oxide, iron oxide, copper oxide, and others.

In a specific embodiment, a method according to an embodiment of the present invention is outlined below.
1. Start;
2. Provide a transparent substrate comprising a surface region;
3. Form a first electrode layer overlying the surface region of the transparent substrate;
4. Form a thin layer (flash) of an alloy material (e.g., copper gallium or gallium sulfide), using a sputtering target of the alloy material, overlying the first electrode layer, which may act as an intermediary adhesive layer;
5. Form a copper layer overlying the thin layer of the alloy material;
6. Form an indium layer overlying the copper layer;
7. Subject at least multi-layered structure formed in steps 3-6 to a thermal treatment process in an environment containing a sulfur bearing species to form a copper indium disulfide alloy material overlying a copper gallium disulfide material, wherein the copper indium disulfide alloy material comprises an atomic ratio of copper:indium ranging from about 1.35:1 to about 3.00:1;
8. Form a window layer overlying the copper indium disulfide alloy material;
9. Form second electrode layer overlying the window layer; and
10. Perform other steps, as desired.

The above sequence of steps provides a method according to an embodiment of the present invention. As shown, the method uses a combination of steps including a way of forming a copper indium disulfide alloy material overlying a copper gallium disulfide material for photovoltaic applications according to an embodiment of the present invention. Other alternatives can also be provided where steps are added, one or more steps are removed, or one or more steps are provided in a different sequence without departing from the scope of the claims herein. For example, the addition of thin layer of the gallium bearing alloy material at step 4 helps to act as an adhesive layer and reacts with the copper layer at step 7 to form the copper gallium disulfide material with strong attachment on the electrode layer. In a preferred embodiment, the attachment facilitates a multilayered structure free from delamination, voids, cracks, and other imperfections. Further details of the present method according to a specific embodiment can be found throughout the present specification and more particularly below.

Figure 1:
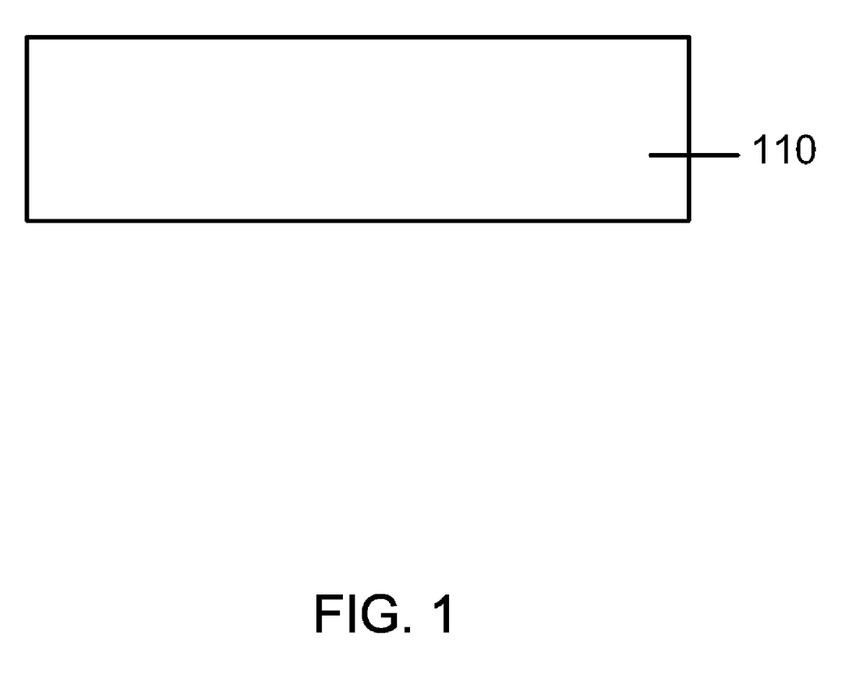
FIGS. 1-8 are schematic diagrams illustrating a method and structure for adhesion absorber material in a thin film photovoltaic device according to embodiments of the present invention.

FIG. 1 is a schematic diagram illustrating a process of a method for forming a thin film photovoltaic device according to an embodiment of the present invention. The diagram is merely an example, which should not unduly limit the claims herein. One skilled in the art would recognize other variations, modifications, and alternatives. As shown in FIG. 1, a substrate 110 is provided. In one embodiment, the substrate 110 includes a surface region 112 and is held in a process stage within a process chamber (not shown). In another embodiment, the substrate 110 is an optically transparent solid material. For example, the substrate 110 can be a glass, quartz, fused silica, or a plastic, or metal, or foil, or semiconductor, or other composite materials. Of course there can be other variations, modifications, and alternatives.

Figure 2:
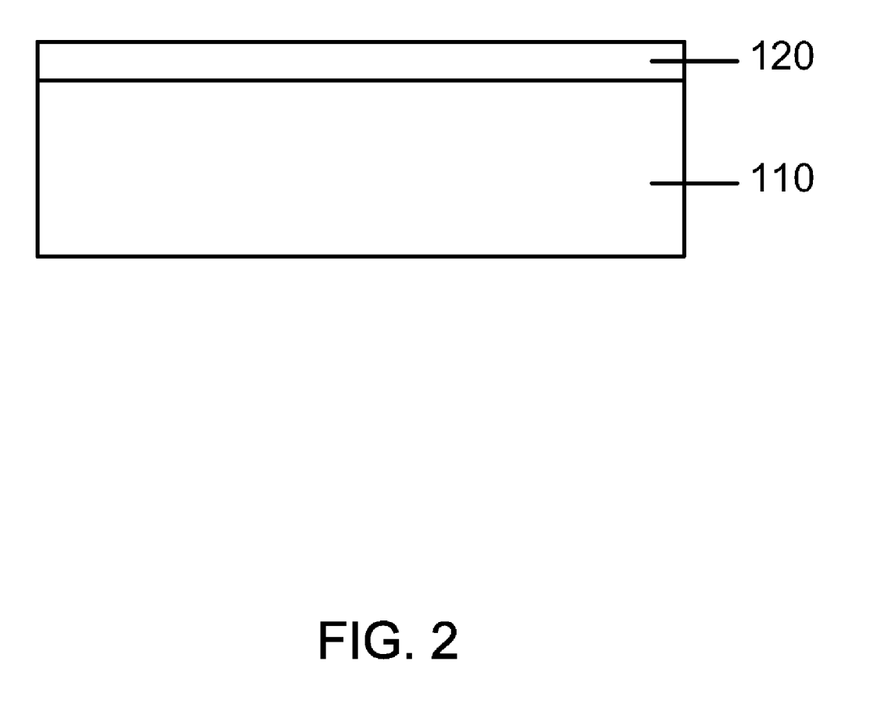

FIG. 2 is a schematic diagram illustrating a process of the method for forming a thin film photovoltaic device according to an embodiment of the present invention. The diagram is merely an example, which should not unduly limit the claims herein. One skilled in the art would recognize other variations, modifications, and alternatives. As shown in FIG. 2, a process for forming a thin film photovoltaic device is to form an electrode layer. In particular, an electrode layer 120 is formed overlying the surface region 112 of the substrate 110. For example, the electrode layer 120 can be made of molybdenum using sputtering, evaporation (e.g., electron beam), electro plating, combination of these, and the like according to a specific embodiment. The thickness of the electrode layer can be ranged from 100 nm to 2 micron and others, characterized by resistivity of about 100 Ohm/cm$^2$ to 10 Ohm/cm$^2$ and less according to a specific embodiment. In a preferred embodiment, the electrode is made of molybdenum or tungsten, but can be others like copper, chromium, aluminum, nickel, or platinum. Of course, there can be other variations, modifications, and alternatives.

Figure 3:
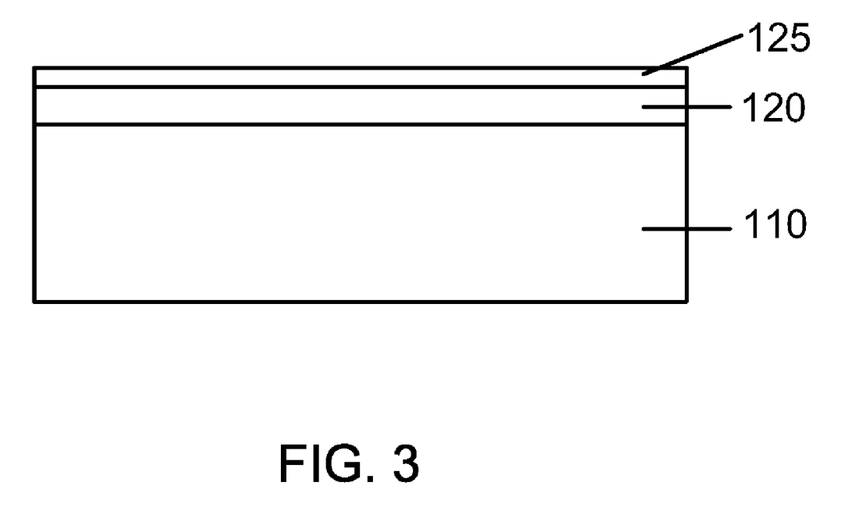

FIG. 3 is a schematic diagram illustrating a process of the method for forming a thin film photovoltaic device according to an embodiment of the present invention. The diagram is merely an example, which should not unduly limit the claims herein. One skilled in the art would recognize other variations, modifications, and alternatives. In a specific embodiment, the method includes forming a thin layer 125 with an alloy material, or simply a thin alloy layer, overlying the electrode layer. The thin alloy layer 125 can be formed using a deposition process, such as sputtering, plating, evaporation, plasma deposition, and the like and any other suitable technique. In a specific embodiment, the thin alloy layer is made of alloy material including copper-gallium or gallium-sulfide, which can also be a combination of other minor species materials, is flashed using a sputtering tool. In a specific embodiment, the thin alloy layer 125 or the thin layer of gallium-bearing alloy material is at least 200 Angstroms or at least 500 Angstroms, but can be at other thickness dimensions.

In a specific embodiment, the thin layer of gallium-bearing alloy material is formed by sputtering a gallium-bearing composite target within an environment provided with argon gas. The sputtering process may use a power of about 120 Watts DC for about ten seconds and less according to a specific embodiment. In a specific embodiment, the argon gas is provided at about a suitable flow rate. In a preferred embodiment, the deposition process is maintained in a vacuum environment, which is about 5 mTorr and less or about 1 mTorr to about 42 mTorr. In a specific embodiment, the gallium-bearing composite target material (e.g., Cu—Ga, or Ga—S target) is characterized by an atomic percentage ranging from less than 20% to less than 15 percent or preferably about 15% and others of gallium concentration. In a specific embodiment, the atomic percent of gallium can be 5 to 15%, as well as other percentages. Additionally, the deposition process can be performed under suitable temperatures such as about 50 Degrees Celsius to about 110 Degrees Celsius according to a specific embodiment.

Figure 3A:
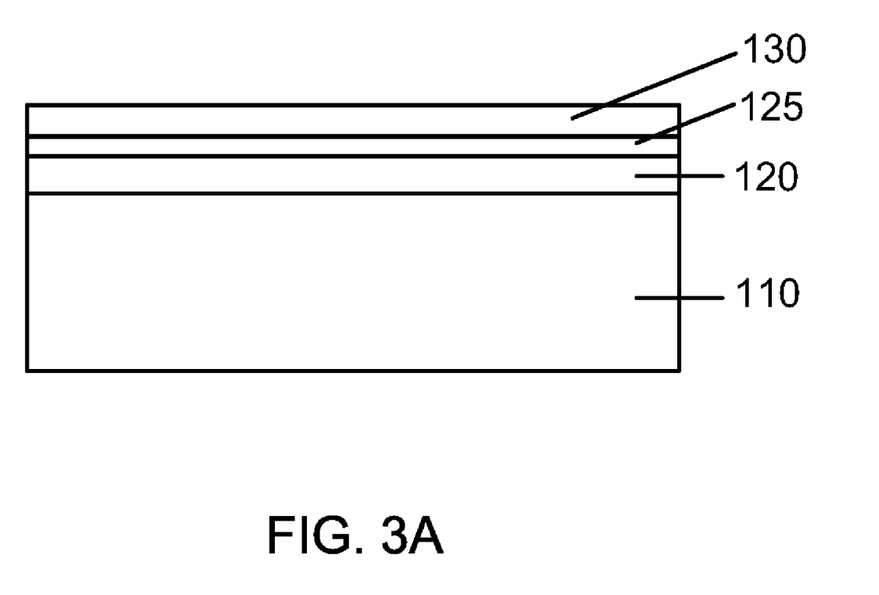

FIG. 3A schematically shows a process of forming a copper layer overlying the thin layer of gallium-bearing alloy material on the electrode layer formed in an earlier process according to an embodiment of the present invention. The diagram is merely an example, which should not unduly limit the claims herein. One skilled in the art would recognize other variations, modifications, and alternatives. In particular, a copper (Cu) layer 130 is formed overlying the thin alloy layer 125 overlying the electrode layer 120. For example, the copper layer 130 is formed using a sputtering process. In one example, a DC magnetron sputtering process can be used to deposit Cu layer 130 onto the thin alloy layer 125 under a following condition. The deposition pressure (using Ar gas) is controlled to be about 6.2 mTorr. The gas flow rate is set to about 32 sccm. The deposition temperature can be just at room temperature without need of intentionally heating the substrate. Of course, minor heating may be resulted due to the plasma generated during the deposition. Additionally, the DC power supply of about 115 W may be required. According to certain embodiments, DC power in a range from 100 W to 150 W is suitable depending specific cases with different materials. The full deposition time for a Cu layer of 330 nm thickness is about 6 minutes or more. Of course, the deposition condition can be varied and modified according to a specific embodiment.

Figure 4:
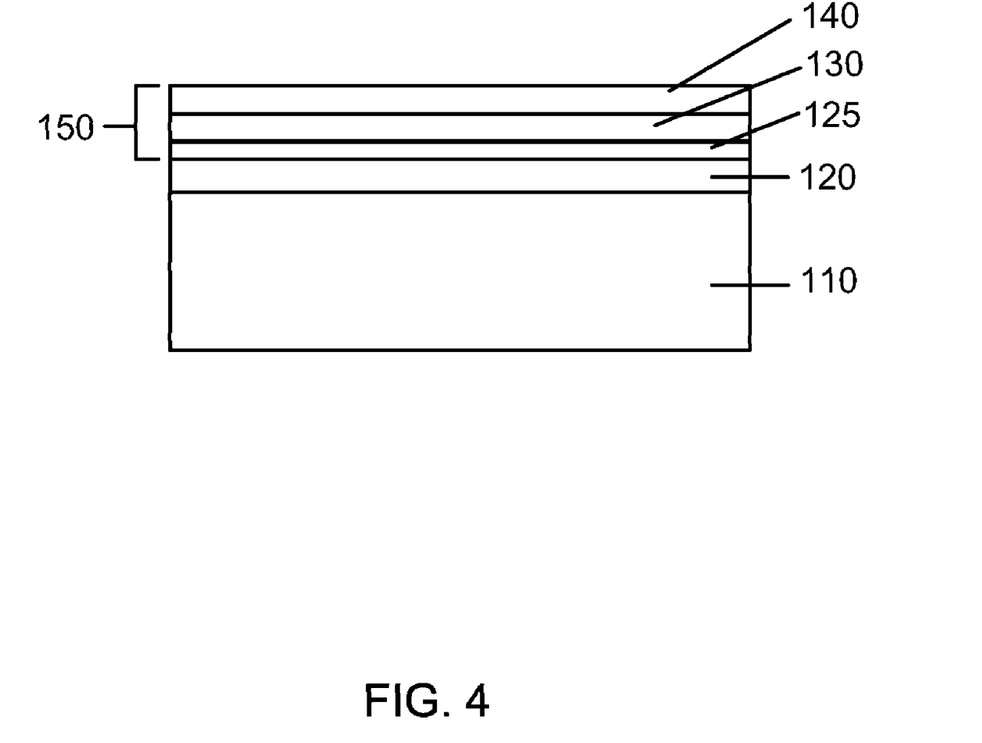

FIG. 4 is a schematic diagram illustrating a process of the method for forming a thin film photovoltaic device according to an embodiment of the present invention. The diagram is merely an example, which should not unduly limit the claims herein. One skilled in the art would recognize other variations, modifications, and alternatives. As shown, a process of providing an indium (In) layer overlying the copper layer is illustrated. The indium layer can be formed using a deposition process, such as sputtering, plating, evaporation, plasma deposition, and the like and any other suitable technique.

In particular, the indium layer 140 is formed overlying the copper layer 130. For example, the indium layer 140 is deposited over the copper layer 130 using a sputtering process. In one example, a DC magnetron sputtering process can be used to deposit In layer 140 overlying the Cu layer 130 under a similar condition for depositing the Cu layer. The deposition time for the indium layer may be shorter than that for Cu layer. For example, 2 minutes and 45 seconds may be enough for depositing an In layer of about 410 nm in thickness. In another implementation, the indium layer can be provided overlying the copper layer by an electro plating process, or others dependent on specific embodiment.

According to embodiments of the present invention, FIGS. 1 through 4 illustrate a series of processes of formation of a multilayered structure 150 comprising copper and indium attached with an electrode layer mediated by a thin gallium-bearing alloy layer on an electrode (e.g. molybdenum) layer overlying a transparent substrate. The series of processes are provided as a method of forming a thin film photovoltaic device according to embodiments of the present invention. In a specific embodiment, the copper layer 130 as well as the indium layer 140 are provided with an stoichiometric control to ensure that the formed multilayered structure 150 is a Cu-rich material with an atomic ratio of Cu:In greater than 1 therein. For example, the atomic ratio of Cu:In can be in a range from 1.2:1 to 2.0:1. In one implementation, the atomic ratio of Cu:In is between 1.35:1 and 1.60:1. In another implementation, the atomic ratio of Cu:In is selected to be about 1.55:1. In other examples, the atomic ratio of Cu:In can be 1.3:1 or greater. In another example, the atomic ratio of Cu:In is between 1.35:1 and 3.0:1. In a specific embodiment, the formation process of indium layer 140 substantially causes no change in atomic stoichiometry in the copper layer 130 plus the thin gallium-bearing alloy material formed earlier. In another specific embodiment, the formation process of the indium layer 140 is performed earlier overlying the gallium-bearing alloy thin layer 125 on the electrode layer 120 while the formation process of the copper layer 130 is performed later overlying the indium layer 140.

Figure 5:
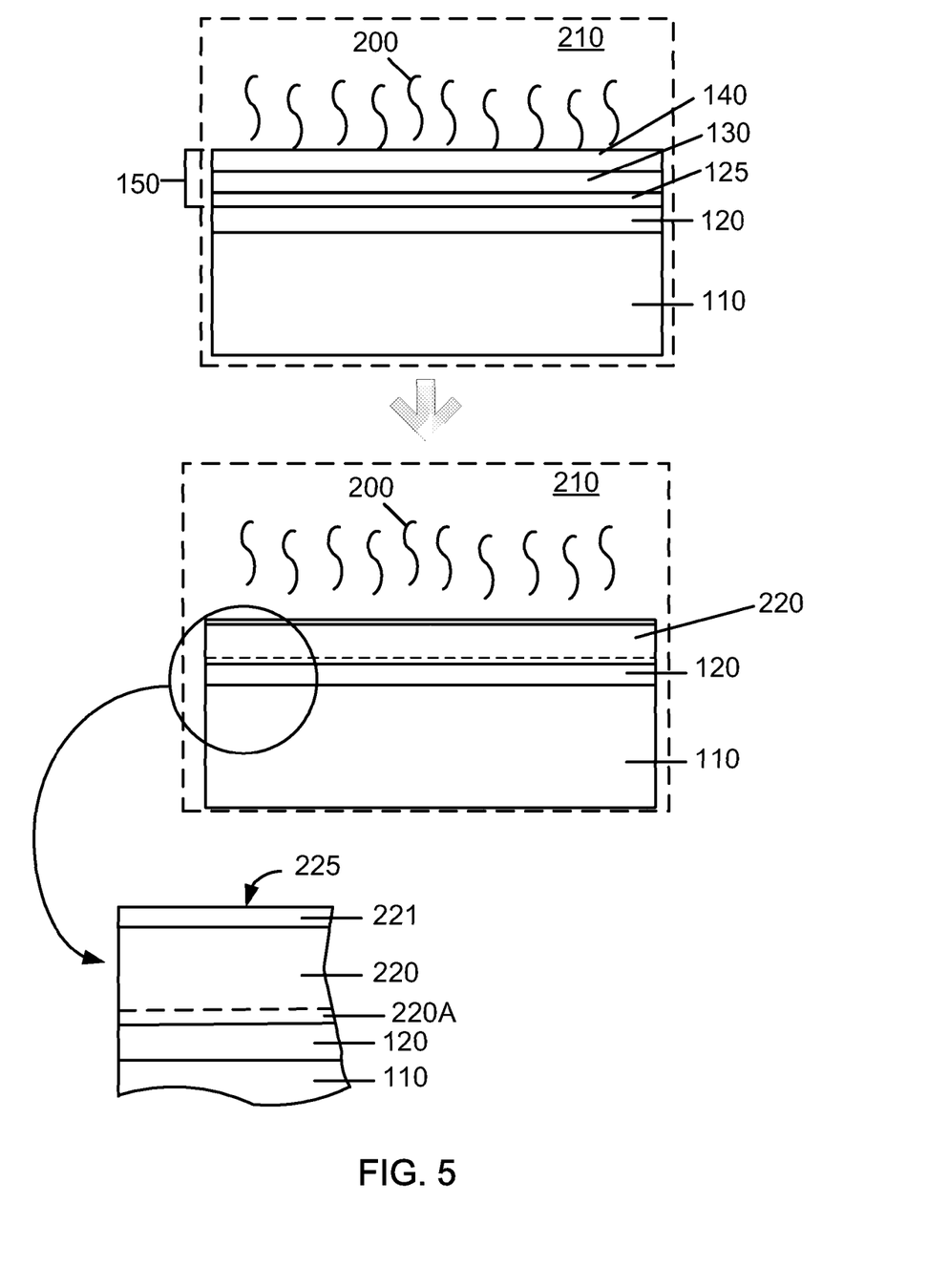

FIG. 5 is a schematic diagram illustrating another process of the method for forming a thin film photovoltaic device according to an embodiment of the present invention. The diagram is merely an example, which should not unduly limit the claims herein. One skilled in the art would recognize other variations, modifications, and alternatives. As shown, the formed multilayered structure 150 comprising at least an indium layer 140 overlying a copper layer 130 plus a thin layer of gallium-bearing alloy material 125 is subjected to a thermal treatment process 200 in an environment containing a sulfur bearing species 210 at an adequate pressure and at a temperature of about 400 Degrees Celsius to about 600 Degrees Celsius for about three to fifteen minutes for a rapid thermal process according to a specific embodiment. Of course, the thermal treatment process 200 includes certain predetermined ramp-up and ramp down period with certain predetermined rates for substrate temperature changes. The hydrogen sulfide gas is provided through one or more entry valves with flow rate control into the process chamber where the hydrogen sulfide gas pressure is under controlled by one or more pumps. Of course, there can be other variations, modifications, and alternatives.

In one example, the sulfur bearing species are in a fluid phase. As an example, the sulfur can be provided in a solution, which has dissolved $Na_2S$, $CS_2$, $(NH_4)_2S$, thiosulfate, and others. In another example, the sulfur bearing species 210 are hydrogen sulfide in gas phase. In other embodiments, the sulfur can be provided in a solid phase. In a solid phase, elemental sulfur source can be heated and allowed to sublime, introducing a gas phase sulfur. In a specific embodiment, the sulfur can be provided as a layer overlying the indium/copper or copper/indium multilayered structure. In a specific embodiment, the sulfur material is provided as a thin layer or patterned layer. Depending upon the embodiment, the sulfur material can be provided in a slurry, powder, solid material, gas, paste, or other suitable form. Of course, there can be other variations, modifications, and alternatives.

In a specific embodiment, the gas phase sulfur is allowed to react to the indium/copper multilayered structure. Referring to the FIG. 5, the thermal treatment process 200 causes a reaction between copper material and indium material within the multilayered structure 150 and the sulfur bearing species 210, thereby transforming the multilayered structure 150 substantially into a layer of copper indium disulfide alloy material (or a copper indium disulfide thin film) 220. In an example, the copper indium disulfide alloy material 220 is transformed by incorporating sulfur ions/atoms stripped or decomposed from the sulfur bearing species into the multilayered structure 150 with indium atoms and copper atoms mutually diffused therein.

In a specific embodiment, the thermal treatment process 200 would result in a formation of a cap layer 221 over the copper indium disulfide alloy material 220. The cap layer 221 contains a thickness of substantially copper sulfide material but substantially free of indium atoms. The copper sulfide material 221 includes a surface region 225 substantially free of indium atoms. The formation of this cap layer 221 is under a stoichiometric Cu-rich conditions for the original Cu—In bearing multilayered structure 150. Depending on the applications, the thickness of the copper sulfide material 221 is on an order of about five to ten nanometers and greater depending on the previously formed multilayered structure 150. Of course, there can be other variations, modifications, and alternatives.

Referring to an detailed sectional view in FIG. 5, the method also subject at least multilayered structure 150 to a thermal treatment process 200 in an environment containing a sulfur bearing species 210 to form a copper indium disulfide alloy material 220 while consuming substantially all of the indium layer from at least the thermal treatment process 200 of the multilayered structure. As noted, the copper indium disulfide alloy material comprises an atomic ratio of copper:indium ranging from about 1.35:1 to about 3.00:1 and, optionally, the copper indium disulfide alloy material 220 has a thickness of more than 2× of the thin layer of the indium layer 140 overlying the copper layer 130 overlying the thin layer of gallium-bearing alloy layer 125. As also show is the cap layer 221 of copper sulfide material, which is formed once the copper indium disulfide alloy material 220 is formed. In another specific embodiment, the method further comprises converting the thin layer of gallium-bearing alloy layer 125, i.e., the adhesive layer, into a portion of the copper indium disulfide alloy material 220 during the thermal treatment process 200. In yet another specific embodiment, all of the adhesive layer is converted to a layer of copper gallium disulfide material 220A. The layer 220A forms an interface region to maintain substantial attachment between the copper indium disulfide material 220 and underlying electrode layer 120. Further details of such attachment is provided throughout the present specification and more particularly below.

Figure 6:
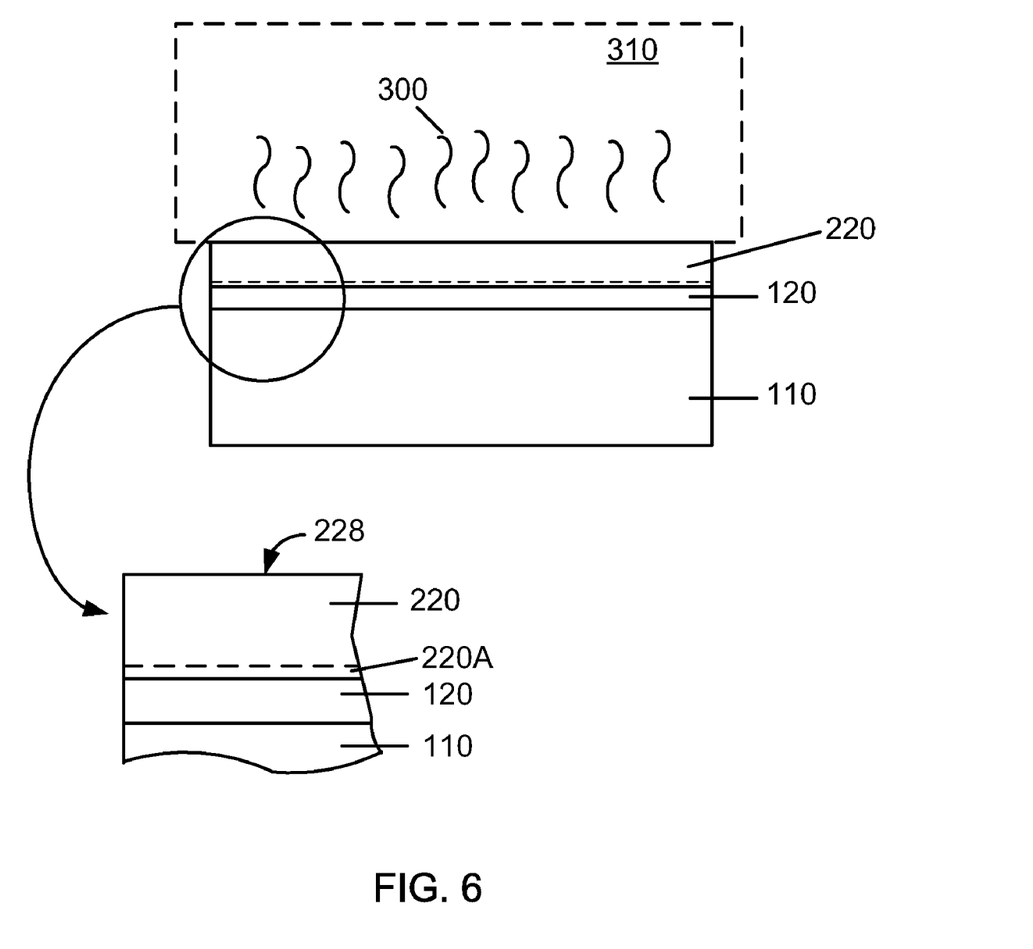

FIG. 6 is a schematic diagram illustrating a process of the method for forming a thin film photovoltaic device according to an embodiment of the present invention. The diagram is merely an example, which should not unduly limit the claims herein. One skilled in the art would recognize other variations, modifications, and alternatives. As shown in FIG. 6, a surface treatment or dip process 300 is performed to the cap layer 221 containing copper sulfide material that covers the copper indium disulfide alloy material 220. In particular, the dip process 300 is also an etching process performed by exposing the surface region 225 to 1 to about 10 weight % solution of potassium cyanide 310 according to a specific embodiment. The potassium cyanide acts as an etchant that is capable of selectively removing copper sulfide material 221. The etching process starts from the exposed surface region 225 and downward to the thickness of the cap layer 221 of copper sulfide material and is substantially controlled to stop at the interface between the copper sulfide material 221 and copper indium disulfide alloy material 220. As a result the copper sulfide material in the cap layer 221 is selectively removed by the etching process so that a new surface region 228 of the remaining copper indium disulfide alloy material 220 is exposed. In a preferred embodiment, the etching selectivity is about 1:100 or more between copper sulfide material and copper indium disulfide material. In other embodiments, other selective etching species can be used. In a specific embodiment, the etchant species 310 can be hydrogen peroxide. In other embodiments, other techniques including electro-chemical etching, plasma etching, sputter-etching, or any combination of these can be used. In a specific embodiment, the copper sulfide material in the cap layer 221 can be mechanically removed, chemically removed, electrically removed, or any combination of these, among others. In a specific embodiment, the copper indium disulfide alloy material 220 resulted from the above processes is an absorber layer about 1 to 10 microns, but can be other dimensions. Of course, there can be other variations, modifications, and alternatives.

Figure 7:
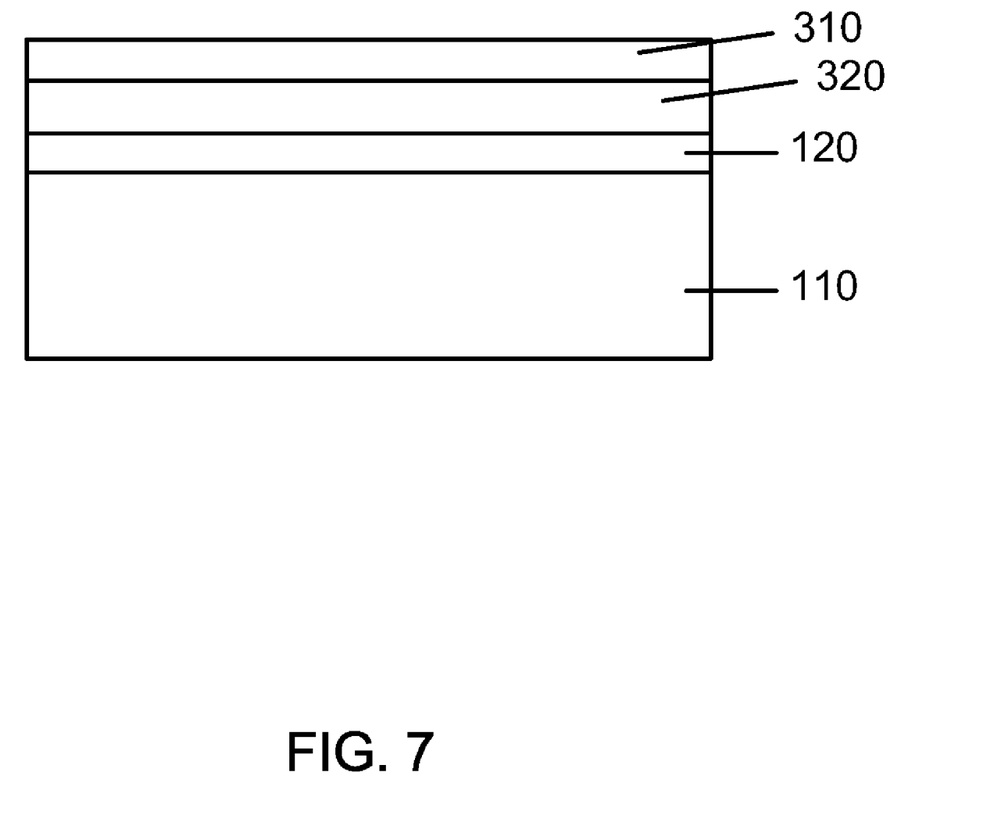

FIG. 7 is a schematic diagram illustrating a process of the method for forming a thin film photovoltaic device according to an embodiment of the present invention. The diagram is merely an example, which should not unduly limit the claims herein. One skilled in the art would recognize other variations, modifications, and alternatives. As shown in FIG. 7, a p-type copper indium disulfide film 320 is formed. In certain embodiments, the previously-formed copper indium disulfide alloy material 220 has possessed a p-type semiconducting characteristic. The p-type copper indium disulfide film 320 is substantially the same as the previous copper indium disulfide alloy material 220. In another embodiment, the copper indium disulfide alloy material 220 is subjected to additional doping process to adjust p-type impurity density therein for the purpose of optimizing I-V characteristic of the high efficiency thin film photovoltaic devices. In one example, aluminum species are mixed into the copper indium disulfide alloy material 220. In another example, the copper indium disulfide alloy material 220 is mixed with a copper indium aluminum disulfide material to form the p-type copper indium disulfide film 320. Of course, there can be other variations, modifications, and alternatives.

Figure 8:
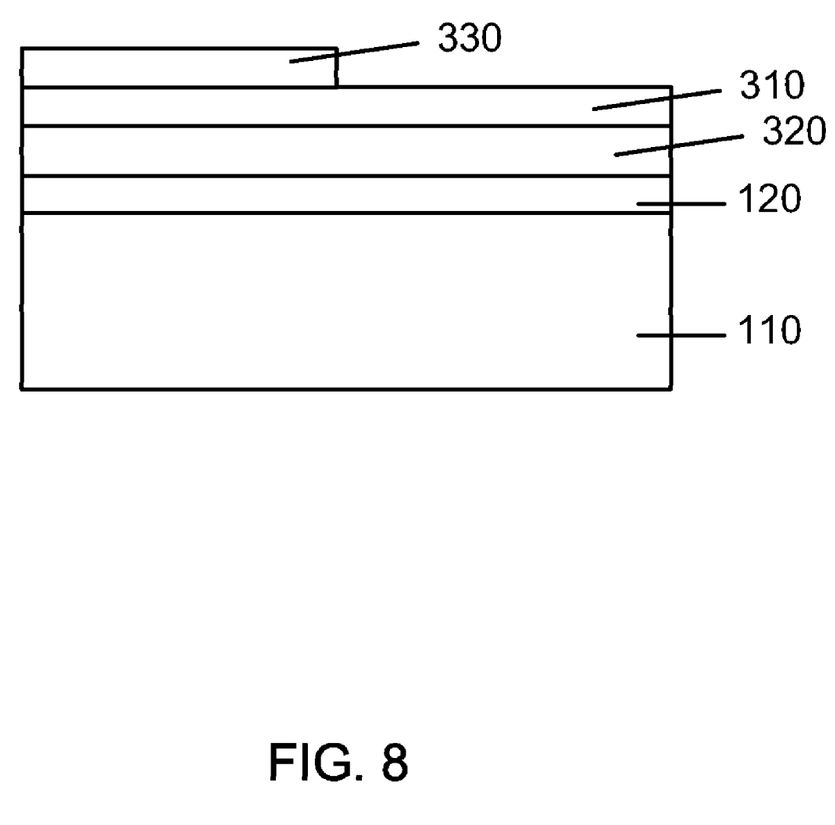

Subsequently as shown in FIG. 7, a window layer 310 is formed overlying the p-type copper indium disulfide material 320. The window layer 310 can be selected from a group materials consisting of a cadmium sulfide (CdS), a zinc sulfide (ZnS), zinc selenium (ZnSe), zinc oxide (ZnO), zinc magnesium oxide (ZnMgO), or others and may be doped with impurities for conductivity, e.g., $n^+$ type. The window layer 310 is intended to serve another part of a PN-junction associated with a photovoltaic cell. Therefore, the window layer 310, during or after its formation, is heavily doped to form a $n^+$-type semiconductor layer. In one example, indium species are used as the doping element to cause formation of the $n^+$-type characteristic associated with the window layer 310. In another example, the doping process is performed using suitable conditions. In a specific embodiment, a window layer made of ZnO that is doped with aluminum ions can range from about 200 to 500 nanometers. Of course, there can be other variations, modifications, and alternative FIG. 8 is a schematic diagram illustrating a process of the method for forming a thin film photovoltaic device according to an embodiment of the present invention. The diagram is merely an example, which should not unduly limit the claims herein. One skilled in the art would recognize other variations, modifications, and alternatives. As shown in FIG. 8, a conductive layer 330 is added at least partially on top of the window layer 310 to form a top electrode layer for the photovoltaic device. In one embodiment, the conductive layer 330 is a transparent conductive oxide TCO layer. For example, TCO can be selected from a group consisting of $In_2O_3$:Sn (ITO), ZnO:Al (AZO), $SnO_2$:F (TFO), and can be others. In another embodiment, the formation of the TCO layer is followed a certain predetermined pattern for effectively carried out the function of top electrode layer for the photovoltaic device with considerations of maximizing the efficiency of the thin film based photovoltaic devices. In a specific embodiment, the TCO can also act as a window layer, which essentially eliminates a separate window layer. Of course there can be other variations, modifications, and alternatives.

To prove the principles and operation of the present invention, experiments have been performed. These experiments were merely examples, which should not unduly limit the scope of the claim herein. Once of ordinary skill in the art would recognize many variations, modifications, and alternatives. The photovoltaic films were made using a copper indium adhesion material, which was less than about 100 nanometers, although other materials may also work. The adhesion material generally prevented delamination of the absorber film from the transparent conductive oxide overlying the glass substrate for the present bifacial photovoltaic cell. In one or more examples, photovoltaic samples without the adhesion film had about 50% yield or less, while photovoltaic samples with the copper indium adhesion material had about 80% or greater and 90% or greater yields. Accordingly, the experiments clearly demonstrated that the present adhesion material has been effective in improving the photovoltaic devices. Again, there can be other variations, modifications, and alternatives.

Although the above has been illustrated according to specific embodiments, there can be other modifications, alternatives, and variations. It is understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for forming a thin film photovoltaic device, the method comprising:

providing a transparent substrate comprising a surface region;

forming a first electrode layer overlying the surface region of the transparent substrate;

forming a thin layer of at least copper gallium material or gallium sulfide material, using a sputtering target of copper gallium material or gallium sulfide material, respectively, overlying the first electrode layer to act as an intermediary adhesive layer to facilitate attachment to the first electrode layer;

forming a copper layer overlying the thin layer of at least copper gallium material or gallium sulfide material;

forming an indium layer overlying the copper layer to form a multilayered structure including at least the thin layer, copper layer, and the indium layer;

subjecting at least the multilayered structure to thermal treatment process in an environment containing sulfur bearing species to form a copper indium disulfide alloy material, the copper indium disulfide alloy material comprising an atomic ratio of copper:indium ranging from about 1.2:1 to about 3.0:1 overlying a copper gallium disulfide material converted from the thin layer of at least copper gallium material or gallium sulfide material; and forming a window layer overlying the copper indium disulfide alloy material.

2. The method of claim 1 wherein the thin layer is at least 200 Angstroms.

3. The method of claim 1 wherein the thin layer is at least 500 Angstroms.

4. The method of claim 1 wherein the forming thin layer is provided by flash sputtering a gallium-bearing target using an argon gas.

5. The method of claim 4 wherein the forming the thin layer is at 120 Watts DC for about ten seconds and less.

6. The method of claim 4 wherein the argon gas is also maintained in a sputtering chamber.

7. The method of claim 4 wherein the gallium-bearing target comprises a gallium element atomic percentage of about 15% and less.

8. The method of claim 1 further comprising maintaining a pressure for disposing the transparent substrate within about 5 mTorr and less.

9. The method of claim 1 further comprising maintaining a pressure disposing the transparent substrate from about 1 mTorr to about 42 mTorr.

10. The method of claim 1 wherein the forming of the thin layer is provided in a first station, wherein the forming of the copper material is provided in a second station, and wherein the forming of the indium layer is provided in a third station.

11. The method of claim 1 further comprising moving the transparent substrate from a first station to a second station after forming the thin layer, the second station including an indium target and a copper target.

12. The method of claim 11 wherein the indium material within the indium target is characterized by at least 99.99% purity.

13. The method of claim 1 wherein the forming of the thin layer is performed at a temperature ranging from about 50 Degrees Celsius to about 110 Degrees Celsius.

14. The method of claim 1 further comprising maintaining the copper indium disulfide alloy material mediated via the thin layer substantially free from delaminating from the first electrode layer during the thermal treatment process.

15. The method of claim 1 further comprising performing a surface treatment process to remove a layer of copper sulfide material from a surface region of the copper indium disulfide alloy material.

16. The method of claim 1 further comprising forming a second electrode layer overlying the window layer, the second electrode layer comprising a TCO material.

* * * * *